United States Patent [19]

Redwine

[11] 4,110,639

[45] Aug. 29, 1978

[54] ADDRESS BUFFER CIRCUIT FOR HIGH SPEED SEMICONDUCTOR MEMORY

[75] Inventor: Donald J. Redwine, Houston, Tex.

[73] Assignee: Texas Instruments Incorporated, Dallas, Tex.

[21] Appl. No.: 748,790

[22] Filed: Dec. 9, 1976

[51] Int. Cl.² .................. H03K 3/286; H03K 3/353; G11C 8/00
[52] U.S. Cl. .................................. 307/279; 307/270; 307/362; 307/DIG. 1; 307/DIG. 4; 307/DIG. 5; 365/230
[58] Field of Search ............... 307/238, 279, 270, 264, 307/DIG. 1, DIG. 3, DIG. 4, DIG. 5, 350, 362; 365/230, 231

[56] References Cited

U.S. PATENT DOCUMENTS

| | | | |
|---|---|---|---|
| 3,796,893 | 3/1974 | Hoffman et al. | 307/251 X |
| 3,848,237 | 11/1974 | Geilhufe | 307/279 X |
| 3,902,082 | 8/1975 | Proebsting et al. | 307/279 |
| 3,906,464 | 9/1975 | Lattin | 307/DIG. 3 X |
| 3,959,781 | 5/1976 | Mehta et al. | 307/DIG. 3 X |
| 4,010,453 | 3/1977 | Lewis | 307/279 X |
| 4,028,557 | 6/1977 | Wilson | 307/DIG. 3 X |
| 4,031,415 | 6/1977 | Redwine et al. | 307/DIG. 5 X |
| 4,038,567 | 7/1977 | Lewis et al. | 307/DIG. 3 X |

OTHER PUBLICATIONS

Kuo et al., "16-K RAM Built With Proven Process May Offer High Start-up Reliability"; Electronics (pub.); pp. 81-86; 5/13/76.
Bishop et al., "High-Sensitivity, High Speed FET Sense Latch"; *IBM Tech. Discl. Bull.;* vol. 18, No. 4, pp. 1021-1022; 9/1975.

*Primary Examiner*—Larry N. Anagnos
*Attorney, Agent, or Firm*—James T. Comfort; John G. Graham

[57] ABSTRACT

A high speed address buffer circuit for use in MOS/LSI semiconductor memories or the like. An unbalanced, dynamic cross-coupled pair of MOS driver transistors is used to sense an address input during a short time window, and internal address signals are generated from the state of the sense circuit. Sensing nodes are precharged and equalized prior to the time window, and the node which is to stay at the logic "1" level is held at a high level by boosting capacitors to which a delayed clock signal is applied. The state of the sense circuit is sampled at a time after the delayed clock and high level addresses are generated.

19 Claims, 5 Drawing Figures

ADDRESS BUFFER CIRCUIT FOR HIGH SPEED SEMICONDUCTOR MEMORY

BACKGROUND OF THE INVENTION

Semiconductor integrated circuits are widely used in computer memory. The cost per bit of storage and speed of operation provided by N-channel MOS random access memory (RAM) devices have resulted in wide acceptance thereof in the manufacture of digital equipment, particularly minicomputers. One example of such a device, a 4096 bit RAM, is shown and described in U.S. Pat. No. 3,940,747, filed Aug. 2, 1973 by N. Kitagawa and C-K Kuo, assigned to Texas Instruments, and in Electronics, Sept. 13, 1973, pp. 116-121. A 16K bit RAM is disclosed in copending application Serial Number 682,687 filed May 3, 1976 by N. Kitagawa et al and assigned to Texas Instruments, and in Electronics, May 13, 1976, pp. 81-86.

A semiconductor RAM accepts a multiple bit address from external circuitry, and this address functions to select a specific cell (or cells) within the RAM for writing in data or reading out data. The address is generated by other parts of the system, separate from the RAM; a requirement placed on the circuitry of the RAM is that it responds to timing and voltage levels or logic levels in the address signals which are compatible with the remainder of the system. Often the logic levels in the system are dictated by bipolar or TTL operating voltages, rather than those of MOS devices. The address inputs to the RAM should impose a minimum of current loading on the external circuits, and a minimum of noise or unwanted voltage variations should be generated by the address signal detecting circuitry. The address buffer circuitry should be responsive to the address signals during only a small window in time during the operating cycle of the digital equipment, so that the address signals may change to set up the next access cycle before the existing cycle is completed. Address buffer circuits which function adequately for these purposes are disclosed in pending U.S. Patent Application Serial Number 624,813, filed Oct. 22, 1975, by Redwine and Kitagawa, now U.S. Pat. No. 4,031,415, and Serial Number 716,843, filed Aug. 23, 1976 by Kitagawa and White, both assigned to Texas Instruments, as well as the above-mentioned Sept. 13, 1973 and May 13, 1976 articles in Electronics. Nevertheless, continuing improvement in these factors, particularly speed, is necessary as the cycle time of computer equipment becomes more demanding.

It is therefore the object of the invention to provide an improved circuit for detecting address signals or other logic levels in semiconductor memory devices or the like, particularly a high speed circuit which is compatible in response timing, voltage level, and loading with the remainder of the system in which the device may be used.

SUMMARY OF THE INVENTION

In a specific embodiment of the invention, an address buffer is provided for a semiconductor memory by a pair of cross-coupled MOS driver transistors which function as a differential detector; one of these transistors is larger than the other, providing imbalance. The address input is coupled to one side of the differential pair by a transistor device. The nodes at the outputs of the differential pair are precharged to a high level prior to the address input. Shortly after the address input, equal charges are applied to these output nodes by a pair of capacitors, thus preventing discharge of the node which is to stay at the one level. The state of the output nodes of the cross-coupled pair is detected and address signals generated and latched, shortly after the equal charges are applied, then the address inputs may subsequently change without affecting the internal address signals. The cross-coupled driver transistors may have two ground return transistors turned on at different times in the manner of application Serial Number 682,685, Kitagawa and McAlexander, filed May 3, 1976.

THE DRAWINGS

The novel features believed characteristic of the invention are set forth in the appended claims; the invention itself, however, as well as other features and advantages thereof, may best be understood by reference to the following detailed description of a particular embodiment, when read in reference to the accompanying drawings, wherein:

DETAILED DESCRIPTION OF A SPECIFIC EMBODIMENT

The Memory System

Figure 1:
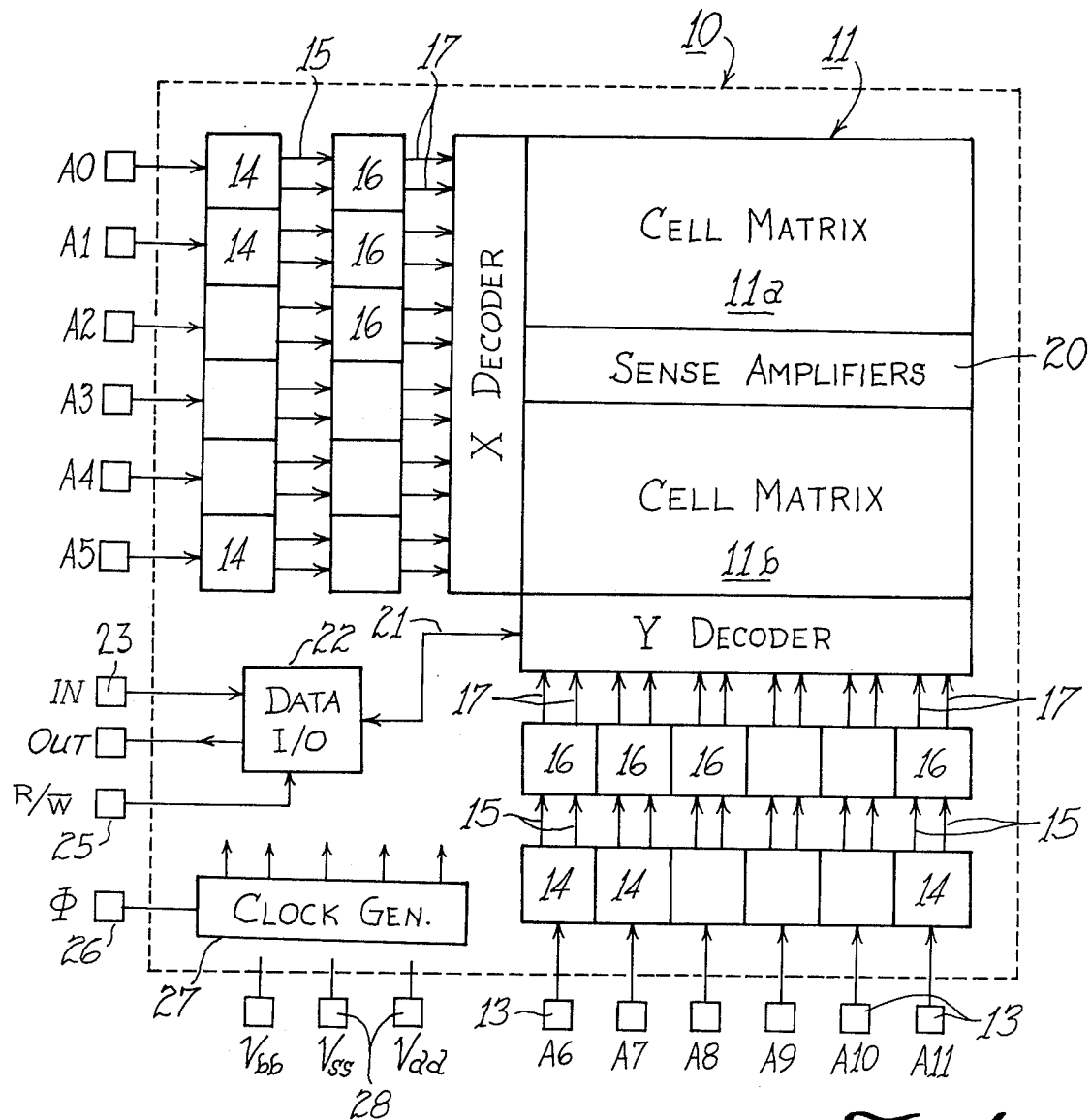
FIG. 1 is a block diagram of a semiconductor memory device which may utilize the invention.

Referring to FIG. 1, a semiconductor memory device which may utilize the invention is illustrated. The memory device is incorporated within a semiconductor chip or bar 10 which in a typical embodiment would be an N-channel, silicon gate MOS/LSI device. The chip 10 includes an array 11 of 4096 memory cells which are partitioned in two cell matrixes 11a and 11b, each of which contains 2048 cells. The array 11 includes 64 rows and 64 columns; the cell matrix 11a contains rows X0 to X31 while the cell matrix 11b contains rows X32 to X63; columns Y0 to Y63 are contained in both cell matrix 11a and cell matrix 11b. Only one cell of the 4096 cells in the array 11 is addressed at a given time; this requires a six-bit (one of 64) X address which is applied to six X address pins 12 labelled A0 to A5, as well as a six-bit (one of 64) Y address applied to six Y address pins 13 labelled A6 to A11.

The X address is applied from pins 12 to six identical address sense circuits 14 (constructed according to the invention) which sense the address inputs and generate signals and their complements on lines 15. Six identical address output circuits 16 receive the outputs from the sense circuits on the lines 15 and generate high level address signals and their complements (referred to as X0, $\overline{X0}$, X1, $\overline{X1}$, etc.) which are applied via lines 17 to an X or row address decoder 18 that may be of conventional form. The X decoder 18 provides selection of 1-of-32 row address lines going to cell matrix 11a or 1-of-32 row address lines 18 going to cell matrix 11b. In addition, selection of dummy cells in the non-selected cell matrix is provided by the X decoder according to U.S. Pat. No. 3,940,747 or the publications mentioned above.

In like manner, the Y address is applied from pins 13 to six address sense circuits 14 and via lines 15 to six address output circuits 16 just as used for the X address. These circuits (constructed according to the invention) generate six binary address signals and their complements on lines 17 to be applied to a Y decoder 19 which may be of the type described in U.S. Pat. No. 3,940,747. The Y decoder 19 provides selection of 1-of-64 column lines within the cell matrixes 11a and 11b. Each column line is bisected by a one of a set of sixty-four sense amplifiers 20 which function to detect the low level signals produced by the memory cells and provide a full logic level readout for refresh or system output. The Y decoder 19 also provides input-output selection, and data input and output is provided by a line 21 connected to a data I/O control circuit 22 and thence to a data input pin 23 and output pin 24. Another pin 25 provides read/write (R/$\overline{W}$) select. Other data I/O arrangements include the use of a single pin for both data in and data out, etc. The basic timing signal for the chip 10 is provided by a clock $\Phi$ applied to a chip enable input pin 26 which is connected to timing generator circuitry 27. Various clock pulses such as $\Phi$, $\overline{\Phi}$, $\Phi h$, $\Phi d$, $\Phi A$, etc., used within the chip are produced by the circuitry 27, based on the $\Phi$ input. Supply voltages for the chip 10 are provided by input pins 28 for Vdd which is about +12 volts, ground or Vss, and substrate bias Vbb, which is about −5 volts. Some designs do not require substrate bias, but generate it internally.

Figure 2:
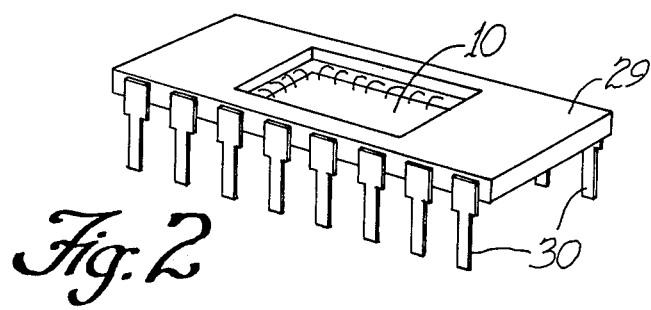
FIG. 2 is a pictorial view of a semiconductor device containing the memory device of FIG. 1.

The semiconductor chip 10 is mounted in a 22-pin, 18-pin or 16-pin dual-in-line package 29 of the type seen in FIG. 2, in accordance with the standard practice in this industry. Bonding pads on the chip 10 are connected to pins 30 via small gold wires ball-bonded to the pads and bonded to internal electrodes for the pins. When sixteen pin packages are used, the address inputs may be multiplexed, in which case the same address buffers of the invention would be used for both X and Y addresses.

THE ADDRESS SENSE CIRCUIT

Figure 3:
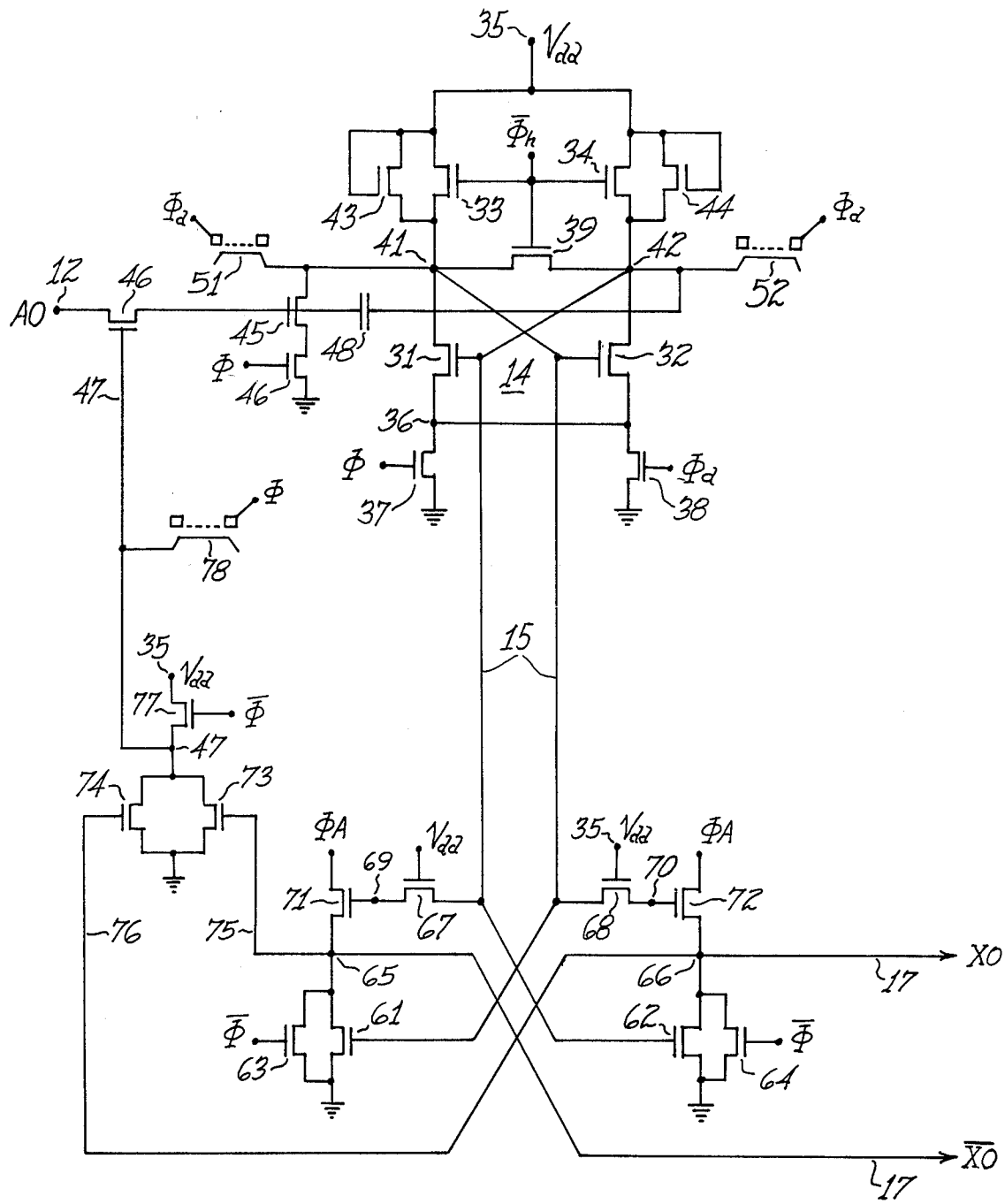
FIG. 3 is an electrical schematic diagram of the circuit of the invention.
Figure 4:
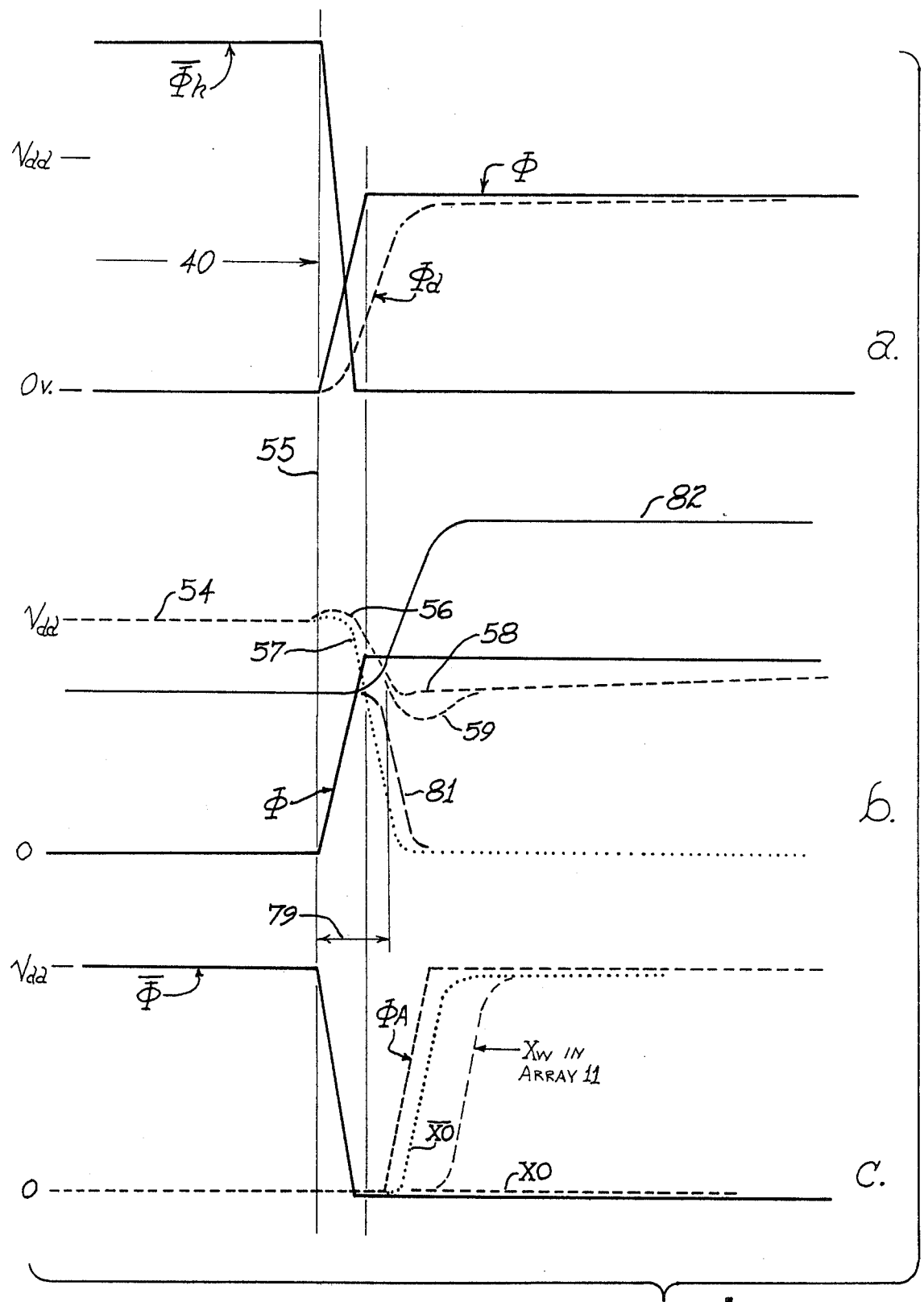
FIGS. 4a–4c are graphic representations of voltages appearing at various points in the circuit of FIG. 3, plotted as a function of time.

Referring to FIG. 3, an address buffer circuit according to the invention is illustrated. The sense circuit 14 includes a cross-coupled flip-flop having a pair of driver transistors 31 and 32, the drains of which are connected through a pair of precharge transistors 33 and 34 to a Vdd supply line 35, typically about +12 V. dc. The sources of the transistors 31 and 32 are connected together at a node 36, which is connected to ground or Vss by two transistors 37 and 38 which turn on at different times. The transistor 37 is much smaller than the transistor 38 and turns on at $\Phi$, while the transistor 38 turns on at $\Phi d$, for the reasons set forth in pending application Serial Number 682,687, filed May 3, 1976, assigned to Texas Instruments. A transistor 39 shunts the sources of the two precharge transistors together at the same time the transistors 33 and 34 are turned on by $\overline{\Phi h}$ during a period 40 as seen in FIG. 4a. A pair of sense nodes 41 and 42 are thus precharged to a high level during a clock voltage $\overline{\Phi h}$; this voltage $\overline{\Phi h}$ is much higher than Vdd so the drop across the transistors 33 and 34 is very low. The nodes 41 and 42 thus charge to Vdd during $\overline{\Phi h}$ or the period 40. Small depletion mode devices 43 and 44 (about one-tenth the size of the precharge transistors) shunt the transistors 33 and 34. Merely to assure operation on the first cycle: the nodes charge very slowly from Vdd through the devices 43 and 44 so the circuit will operate on the first $\Phi$ pulse without a proceeding $\overline{\Phi h}$. The nodes 41 and 42 are connected to the gates of the transistors 32 and 31 respectively, to provide cross-coupling for flip-flop or bistable operation. The node 41 is connected to ground through a pair of input transistors 45 and 46 to provide the address signal input; the transistor 46 is turned on by $\Phi$, so the buffer is not responsive until $\Phi$ goes positive. The address signal from the input terminal 12 is connected to the gate of the transistor 45 through a series transistor 46 which is turned on by charging its gate node 47 during $\overline{\Phi}$ then turned off after an address level is generated, as will be explained; thus a time window is created during which the circuit can accept an address. Identical gated capacitor devices 51 and 52 are connected to the nodes 41 and 42 for coupling a charge thereto when the delayed clock $\Phi d$ occurs. To equalize the transient disturbance from the input signal A0, a capacitor 48 connects the input line to the node 42; this capacitor has about the same value as the gate to drain capacitance of the transistor 45.

OPERATION OF THE ADDRESS SENSE CIRCUIT

During the period 40 of FIG. 4a, $\overline{\Phi h}$ is high and $\Phi$ and $\Phi d$ are low. The transistors 37 and 38 are cut off by $\Phi$ and $\Phi d$, so the driver transistors 31 and 32 cannot conduct. The transistors 33, 34 and 39 are held full on by $\overline{\Phi h}$ which is at a level much higher than Vdd, so the nodes 41 and 42 charge to Vdd and equalize at a level shown by a line 54. The transistor 46 is off, so the sense circuit is not responsive to an address. The gates of the gated capacitors 51 and 52 are high, so the silicon under the gates is inverted and the capacitors have a high magnitude. At time 55, which is the beginning of the sense period, $\overline{\Phi h}$ starts down, and $\Phi$ starts up. The transistors 33, 34 and 39 turn off at the time the voltage of $\overline{\Phi h}$ reaches Vdd + Vt. The transistor 37 begins to turn on when $\Phi$ reaches Vt; this transistor is small and conducts a small current that initiates the sensing. The nodes 41 and 42 begin to discharge through the transistors 31 and 32 and to ground through the node 36 and the transistor 37. Both of the transistors 31 and 32 are on so long as the nodes 41 and 42 are high; one conducts heavier than the other because it is bigger, so if the address input is a logic "0" or Vss the flip-flop will always come up one way. In one embodiment, the transistor 31 has a channel width to length ratio one-fourth small than the transistor 32, so the latter conducts heavier with zero input. In this case, for logic "0" input, the transistor 32 conducts more current, so the flip-flop ultimately reaches a steady state wherein the transistor 32 is conducting, the transistor 31 is cut off, the node 41 is high, and the node 42 is low. However, if the input 12 is a logic "1", the transistors 45 and 46 both begin to conduct as $\Phi$ reaches Vt, and the node 41 discharges faster than the node 42 due to the path to ground through these devices. So, for "1" input, the voltages on the nodes 41 and 42 will resemble the lines 56 and 57 of FIG. 4b. The node 41 drops faster than the node 42, and this tends to reduce the gate voltage on the transistor 32 and reduce its conduction, thus holding the node 42 higher. When $\Phi d$ goes above Vt, the transistor 38 begins to conduct, and this provides a lower-resistance path to ground so one of the transistors 31 or 32 will conduct heavier, producing a more distinct zero level for the zero-going side. Sensing is enhanced by having only the higher resistance transistor 37 conductive in the initial part of the sense operation. Also, as $\Phi d$ goes high, a pulse of charge is coupled through the capacitors 51 and 52; this tends to hold the "1" side high, while the transistor 31 or the zero-going side merely conducts this added charge to ground as it is by this point rather highly conductive. The operation of the capacitors 51 and 52 and the delayed clock $\Phi d$ function to prevent the voltage on the "1" side from decaying very low at a point 59 before charging back up. As shown by dotted line 59, without this feature the voltage goes too low as this point, and it takes time to charge it back up, so the capacitors 51 and 52 speed up the operation of the circuit. The voltage on the node 42 stabilizes at a value of slightly below one $Vt$ below $Vdd$, and will slowly charge back up to $Vdd$ due to the depletion mode device 44. The voltage on the node 41 discharges to $Vss$, reaching this value in about 50 ns.

THE ADDRESS OUTPUT CIRCUIT

The nodes 41 and 42, which contain the voltages defined by the lines 56 and 57 of FIG. 4b, are connected via lines 15 to the gates of a pair of output transistors 61 and 62 in the output circuit 16. Each of the output transistors is shunted by a transistor 63 or 64 which is turned on and off by $\overline{\Phi}$. When $\overline{\Phi}$ is high, address outputs on output nodes 65 and 66 are at $Vss$. When $\overline{\Phi}$ is low the transistors 63 and 64 are off and the status of the nodes 65 and 66 is determined by the nodes 41 and 42 because the gates of transistors 61 and 62 are connected to the nodes 41 and 42.

The lines 15 are also connected by transistors 67 and 68 to nodes 69 and 70 at the gates of load transistors 71 and 72. The purpose of this arrangement is to pump the voltage on one of the nodes 69 and 70 to a voltage much higher than $Vdd$ so that the address output which is to be a "1" will be at a high level. The drains of the transistors 71 and 72 are connected to a $\Phi A$ clock which, as seen in FIG. 4c, goes high (to $Vdd$) after $\Phi d$. The nodes 65 and 66 are connected to the gates of a pair of transistors 73 and 74 via lines 75 and 76, and of course these nodes are also the output lines 17 upon which X0 and $\overline{X0}$ occur. The output of the transistors 73 and 74 is the node 47 which is the gate of the input series transistor 46. This node 47 is precharged during $\overline{\Phi}$ through a transistor 77. A gated capacitor 78 connected to the $\Phi$ clock adds charge to the node 47 when $\Phi$ goes high, merely to assure that the transistor 46 is full on at the beginning of the sense period.

OPERATION OF THE ADDRESS OUTPUT CIRCUIT

During $\overline{\Phi}$, the transistors 63 and 64 are on and the address outputs X0 and $\overline{X0}$ are at $Vss$, nodes 65 and 66 are at $Vss$, and the transistors 73 and 74 are thus cut off. The node 47 is charged to ($Vdd$-$Vt$) via the transistor 77. In the interval 79 of FIG. 4c after $\overline{\Phi}$ goes low and before $\Phi A$ goes high, the nodes 65 and 66 do not change because the supply voltage for the transistors 71 and 72 does not yet exist, i.e., $\Phi A$ is still at zero. So, even though the voltage on the lines 15 is high enough to turn on the transistors 61 and 62, nodes 65, 66 are at $Vss$. The voltage on the nodes 69 and 70 at this point is about ($Vdd$-$Vt$) due to charging from the nodes 41 and 42 via lines 15 and the transistors 67 and 68 during $\overline{\Phi}$. The transistors 67 and 68 have their gates at $Vdd$ so they act as isolating devices. By the time $\Phi A$ goes high, the nodes 41 and 42 will have completed the sense operation and almost reached their ultimate separation as seen by the lines 56 and 57. For the zero-going node 41 or 42, the corresponding one of the nodes 69 and 70 will discharge to $Vss$ via transistor 67 or 68 as seen by a line 81 in FIG. 4b. For the one-going node, say 42, the corresponding node 69 will not discharge through the transistor 67 but instead will be pumped high by the capacitance of the transistor 71 when $\Phi A$ goes high, as seen by the line 82 of FIG. 4b. The transistors 71 and 72 are laid out to have rather high capacitance, and during the time prior to $\Phi A$ the gates of these transistors are high and sources and drains are low so the devices act as gated capacitors. For the "1" side, the transistor 67 stays off, the node 69 stays high, and the capacitance value of the transistor 71 stays high. For the zero-going side, the transistor 68 conducts, draining off the charge on the node 70 and lowering the capacitance magnitude of the source-drain to gate of the transistor 72; thus little charge is pumped to the node 70 by $\Phi A$. The timing of the clocks should be such that the zero-going node (node 70 for example) discharges as seen by the line 81 down to about $Vt$ before $\Phi A$ comes on, or a noise spike will be produced on the output node 66 at X0.

One of the X0 or $\overline{X0}$ signals apparing on the nodes 65 and 66 will be a high level because of the pump up of the "1" node 69 or 70. When one of these is high, one of the transistors 73 or 74 turns on and the node 47 discharges, cutting off the transistor 46 and rendering the sense circuit 14 no longer responsive to addresses on the line 12, until the next cycle.

SYSTEM TIMING

Figure 5:
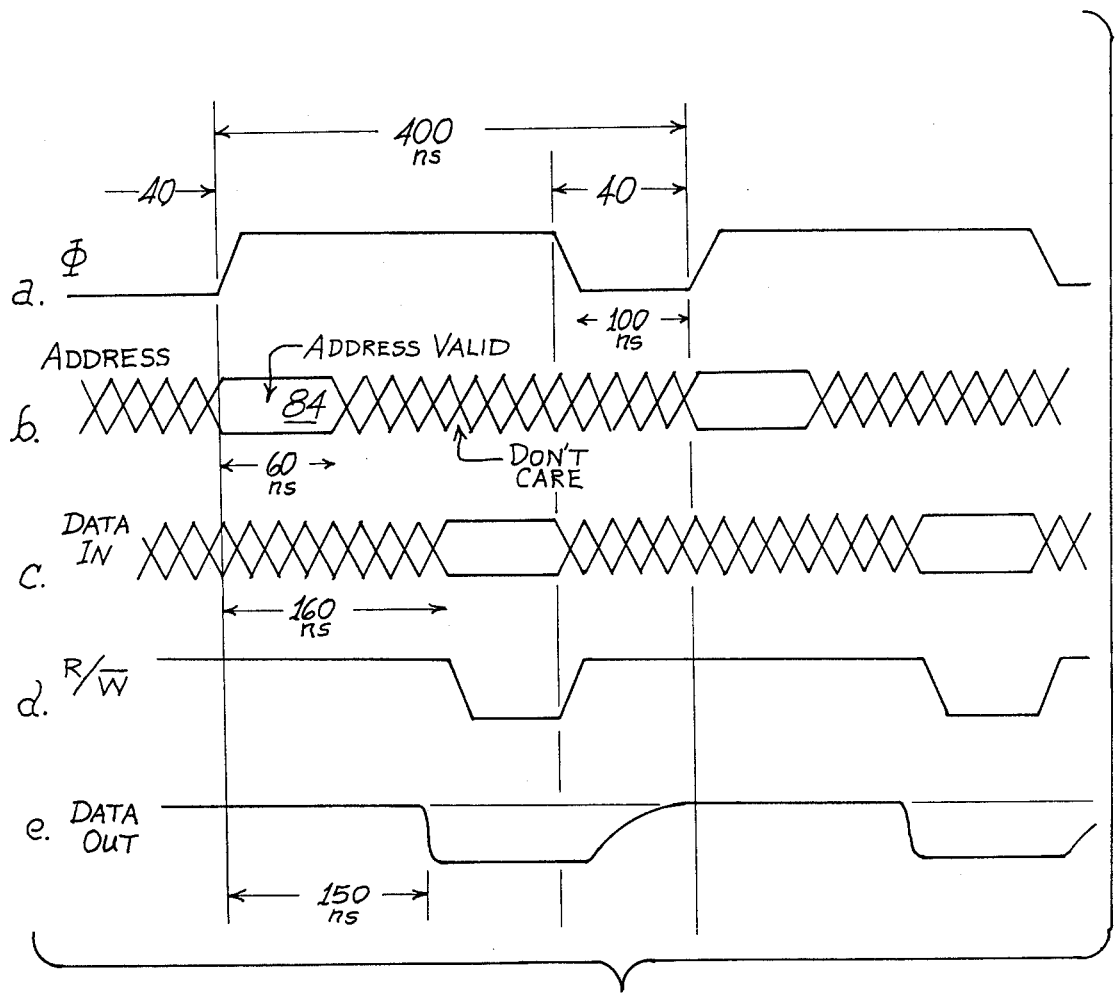
FIGS. 5a–5e are graphic representations of voltages appearing at various points in a memory system employing the device of FIG. 1, plotted as a function of time.

As seen in FIG. 5a, the "chip enable" clock $\Phi$ is a recurring clock having a cycle time of perhaps 400 ns. The address signals should be valid during a window 84 of about 60 ns. as seen in FIG. 5b. The address inputs on the pins 12 and 13 should be valid when $\Phi$ goes high and need remain valid only for a short time after that. For write, the input data on the pin 23 should be valid during the later part of $\Phi$ as seen in FIG. 5c. The R/$\overline{W}$ input on the pin 25 is as shown in FIG. 5d, and data out on a read operation is valid during a period at the later part of $\Phi$ as seen in FIG. 5e.

OTHER EMBODIMENTS

The circuit described could be used without the depletion mode devices 43 and 44 as memory system designs often do not rely on first-cycle operation. The capacitor 78 is not critical and could be omitted. Two main features of the circuit, i.e., the timed charging by capacitors 51 and 52 and the operation of the transistors 71 and 72 with $\Phi A$ and its influence on the nodes 69 and 70, could be used independently of one another; that is, one has utility without the other. The features of the invention could be used in sense amplifiers for cell arrays, in intermediate output buffers. as well as input circuits other than address inputs. For example, the data inputs to a high speed microprocessor may require circuits of this capability. Various control or logic inputs to an MOS/LSI chip of any type may employ the invention.

Accordingly, while this invention has been described with reference to an illustrative embodiment, this description is not meant to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An input buffer circuit for an address input of a semiconductor memory device, comprising:

a pair of driver transistors substantially unbalanced in size and characteristic, each driver transistor having a control electrode and two output electrodes, the driver transistors being cross coupled by connection of the control electrode of each to an output electrode of the other;

a pair of precharge transistors, one for each of the driver transistors, the precharge transistors being substantially balanced in size and characteristic, each of the precharge transistors being connected in series with one of the driver transistors and a supply voltage;

means connected to turn on the pair of precharge transistors and to turn off the precharge transistors at a preselected time in an operating cycle;

means to short output electrodes of the pair of cross coupled driver transistors together to equalize the voltages on such output electrodes prior to said preselected time in an operating cycle;

means connected to one of the output electrodes of one of said pair of cross coupled driver transistors to couple said one of the output electrodes to a reference potential when said address input is present beginning at said preselected time;

means for applying a charge to each of the output electrodes a short delay time after said preselected time to retard discharge of one of the output electrodes; and a pair of address signal output circuits, each of which has an input connected to an output electrode of a different one of the pair of cross coupled driver transistors and responsive to the voltage level thereof beginning at a time after said short delay time during an operating cycle, one of the pair of address signal output circuits producing an address signal and the other producing the complement of the address signal.

2. An input buffer circuit according to claim 1 wherein the output electrodes of each of said pair of cross coupled driver transistors are source and drain electrodes and the control electrode is a gate, and the drain electrode of each is directly coupled to the gate of the other.

3. An input buffer circuit according to claim 2 wherein each of the pair of precharge transistors has a source, a drain and a gate, and the source of each is directly connected to the drain electrode of a different one of the pair of cross coupled driver transistors.

4. An input buffer circuit according to claim 3 wherein the means to short output electrodes is an equalizer transistor having a source-drain path connecting the drains of the driver transistors.

5. An input buffer circuit according to claim 4 wherein a clock source having a voltage level higher than said supply voltage is connected to the gates of the precharge transistors and the equalizer transistor, such voltage level going to zero at said preselected time in each operating cycle.

6. An input buffer circuit according to claim 1 wherein the means for applying a charge to the output electrodes of the cross coupled driver transistors comprises a pair of MOS capacitors each separately connected between the drain electrode of one of the pair of cross coupled driver transistors and a source of recurring pulses which being at said short delay after said preselected time and terminate prior to said preselected time during each operating cycle.

7. An input buffer circuit according to claim 6 wherein the means to couple said one output electrode of one of the pair of cross coupled driver transistors to a reference potential comprises two input transistors having their source-drain paths connected in a series path between the drain of one of the pair of cross coupled driver transistors and reference potential.

8. An input buffer circuit according to claim 7 wherein one of the two input transistors has its gate connected to an address input terminal and the other of the two has its gate connected to a source of recurring pulses which begin at about said preselected time during each operating cycle.

9. An input buffer circuit according to claim 8 wherein said one of the two input transistors exhibits a capacitance of a given magnitude, and the address input terminal is coupled to the drain of the other of said pair of cross coupled driver transistors by capacitive means of substantially the same magnitude as that of said one of the two input transistors.

10. An input buffer circuit according to claim 8 wherein the pair of address signal output circuits each comprises first, second and third MOS transistors each of which has a source, a drain and a gate, the source-drain paths of the first and second transistors being connected in series between supply means and a reference potential and the sourcedrain path of the third transistor being connected in parallel with the source-drain path of the second transistor.

11. An input buffer circuit according to claim 10 wherein the input of each of the address signal output circuits comprises a connection from the drain of a different one of the pair of cross coupled driver transistors to the gate of the first transistor in one of the output circuits and to the gate of the second transistor in the other of the output circuits.

12. An input buffer circuit according to claim 11 wherein the gates of the third transistors in each of the output circuits are both connected to a source of recurring pulses which terminate at about said preselected time during each operating cycle.

13. An input buffer circuit according to claim 12 wherein said supply means is a source of recurring pulses which begin after said short delay time in each operation cycle.

14. An input buffer circuit according to claim 13 wherein the address signal and the complement of the address signal are produced at the node between the first and second MOS transistors in the pair of address signal output circuits.

15. An input buffer circuit according to claim 14 wherein means, having an input connected to receive the address signal and the complement of the address signal and having an output coupled to a gate of a series transistor which has its source-drain path in series between the address input terminal and said one of the input transistors is operative to terminate response to an address input after an address signal or complement occurs.

16. An input buffer circuit according to claim 8 wherein feedback means responsive to the occurence of the address signal and the complement of the address signal from the address signal output circuits produces an input to means connected to gate an address input from said address input terminal to said one of the input transistors.

17. An input latch for a semiconductor integrated circuit of the type employing insulated gate field effect transistors, comprising:
- a pair of driver transistors unbalanced in characteristic, each driver transistor having a source-drain path and a gate,
- a pair of precharge transistors each having a source-drain path and a gate,
- means connecting the source-drain path of each of the driver transistors in series with the source-drain path of a different one of the precharge transistors and connecting each series-connected driver and precharge transistor across supply voltage means,
- a pair of sense nodes, one between each of the series-connected source-drain paths of the driver and precharge transistors,
- cross coupling means connecting each sense node to the gate of the other driver transistors,
- means connected to the gates of the precharge transistors to turn on the precharge transistors prior to a first selected time in an operating cycle, and to turn off the precharge transistors at a said first selected time,
- means connected to the pair of sense nodes to equalize the voltages thereon prior to said first selected time in an operating cycle,
- input means connected to one of the sense nodes to couple such node to a reference potential when an input signal is present at a time beginning at said first selected time in an operating cycle,
- charge means connected separately to each of the sense nodes to apply a charge thereto at second time which is after said first selected time in each operating cycle,
- signal output circuit means having input means coupled to at least one of the sense nodes and responsive to the voltage thereon beginning at a third selected time which is after the second selected time in an operating cycle, the signal output circuit means producing a signal during a period of time beginning after said third selected time in an operating cycle.

18. An input latch according to claim 17 wherein the sourcedrain paths of the driver transistors remote from the sense nodes are connected to reference potential through two grounding transistors, one of which cuts on at said first selected time and the other of which cuts on at said second selected time.

19. An input latch according to claim 18 wherein the one grounding transistor is much smaller than the other grounding transistor.

* * * * *